United States Patent [19]
Khoury et al.

[11] Patent Number: 5,912,589
[45] Date of Patent: Jun. 15, 1999

[54] ARRANGEMENT FOR STABILIZING THE GAIN BANDWIDTH PRODUCT

[75] Inventors: John Michael Khoury, New Providence, N.J.; Angelo Rocco Mastrocola, West Lawn, Pa.; Randall Russell Pratt, East Orange, N.J.

[73] Assignee: Lucent Technologies, Murray Hill, N.J.

[21] Appl. No.: 08/883,007

[22] Filed: Jun. 26, 1997

[51] Int. Cl.[6] .................................................. H03F 3/45
[52] U.S. Cl. .......................................... 330/261; 330/256
[58] Field of Search .................................... 330/256, 261, 330/289, 296; 323/907; 527/513

[56] References Cited

U.S. PATENT DOCUMENTS

| | | | |
|---|---|---|---|
| 4,431,971 | 2/1984 | Haque | 330/253 |
| 4,484,089 | 11/1984 | Viswanathan | 307/297 |
| 4,502,019 | 2/1985 | Van Roermund | 330/261 |
| 4,550,284 | 10/1985 | Sooch | 323/315 |
| 4,588,941 | 5/1986 | Kerth et al. | 323/314 |
| 4,929,909 | 5/1990 | Gilbert | 330/261 X |

OTHER PUBLICATIONS

"A 100 dB, 480 MHz OTA in 0.7 $\mu$m CMOS for Sampled–Data Applications", Thomas Burger & Qiuting Huang; IEEE 1996 Custom Integrated Circuits Conference, pp. 101–104.

"High–Precision, Programmable 1–10MHz Bandwidth, 0–2dB Gain Communication Channel for Digital Video Applications", Patrick Siniscalchi, Adam Wyszynski, & Davy Choi, IEEE 1996 Integrated Circuits Conference, pp. 85–88.

"Design of a Bipolar 10–MHz Programmable Continuous–Time 0.05°Equiripple Linear Phase Filter", Geert A. De Veirman & Richard G. Yamasaki, IEEE Journal of Solid–State Circuits, vol. 27. No.3, Mar. 1992, pp. 324–331.

"A 27MHz Programmable Bipolar 0.05°Equiripple Linear–Phase Lowpass Filter", Geert A. De Veirman & Richard G. Yamasaki, ISSCC 92/Session 4/Signal Processing/Paper WP 4.2, pp. 64–65 & p. 244, Feb. 19, 1992.

"Design Considerations for a High–Performance 3$\mu$m CMOS Analog Standard–Cell Library", Carlos A. Laber et al., IEEE Journal of Solid–State Circuits, vol. SC–22, Apr. 1987, pp. 181–189.

"A 20MHz 6th Order BiCMOS Programmable Filter Using Parasitic–Insensitive Integrators", C.A. Laber & P.R. Gray, IEEE 1992 Symposium on VLSI Circuits Digest of Technical Papers, pp.104–105

"A 480MHz Variable Rate QPSK Demodulator for Direct Broadcast Satellite", Theordore Tewksbury et al., 1997 IEEE International Solid–State Circuits Conference, Session 5/Communication Building Blocks 1/Paper TP 5.5 Digest of Technical Papers, 1997, pp. 86–87.

*Primary Examiner*—James B. Mullins

[57] ABSTRACT

A circuit for stabilizing the gain-bandwidth product of analog circuits containing bipolar devices which determine the gm is disclosed. The stabilization circuit is formed to generate a reference current that is proportional to a reference capacitance $C_S$ and the thermal voltage $V_T$. The reference current is ultimately mirrored (as the bias current) into the bipolar devices which determine the gm within the analog circuit. Since the transconductance gm of a bipolar device can be expressed as collector current, $I_C$, divided by $V_T$, the thermal voltage factor of the bias current itself will "cancel" the thermal voltage factor present in the transconductance. The effects related to the remaining variable, the capacitance, will be eliminated as long as the reference capacitance is formed to "track" the analog circuit capacitance by using similar types of capacitance to implement both capacitors and forming both the stabilization circuit and the analog circuit on the same silicon chip. The stabilization circuit can be constructed in modular form and may include a module capable of creating a stabilized RC time constant that is likewise unchanged by variations in temperature or processing.

12 Claims, 2 Drawing Sheets

ARRANGEMENT FOR STABILIZING THE GAIN BANDWIDTH PRODUCT

BACKGROUND OF THE INVENTION

1. Technical Field

The present invention relates to an arrangement for stabilizing the gain-bandwidth product (gm/C) of analog circuits including bipolar devices in which bipolar devices define the gm and, more particularly, to a stabilization arrangement capable of essentially eliminating variations in gm/C related to processing and temperature variations.

2. Description of the Prior Art

A problem arises in the design of certain analog circuits including bipolar devices in which bipolar devices define the gm, such as operational amplifiers (op-amps), continuous time filters, buffers, gain stages and the like. Preferably, the signal bandwidth, stability (Q and phase margin), and noise bandwidth for such devices should be well-controlled for a specified range of operating conditions. However, the gain-bandwidth product (which is equivalent to the ratio of gm/C, as seen below) for these devices, as well as for other analog circuits conducting DC current, is known to change with variations in both processing parameters and ambient temperature. In particular, the gain-bandwidth product for an op-amp is defined as the product of the amplifier's DC gain and the frequency of its dominant pole. For a typical single stage op-amp, for example, the DC gain is defined as gm/go (gm being the input transconductance and go being the output conductance) and the pole is defined as occurring at the frequency go/C (C being the amplifier capacitance at the dominant pole node). Therefore, multiplying (gm/go) by (go/C) yields a "gain-bandwidth product" of gm/C. If the gm/C value for a given analog circuit with a gm defined by bipolar devices can be kept stable over a given range of processing parameters and temperature, the circuit becomes better controlled. For more complicated circuits, the gain bandwidth product can often be reduced to a gm/C type of ratio. Thus, any arrangement that provides additional stability to the gain bandwidth product is useful for a variety of applications.

There are techniques in the prior art that address the desire to stabilize the transconductance or the gain-bandwidth product. For example, it is known to bias bipolar operational amplifiers with currents that are proportional to absolute temperature (PTAT), to counter a reduction in gm with respect to an increase of temperature. Control of temperature-dependent variables is also described in an article entitled "A 27 MHz Programmable bipolar 0.05° Equiripple Linear-Phase Lowpass Filter", by G. A. Veirman et al. appearing in the Proceedings of the 1992 ISSCC at page 64 et seq. Additionally, U.S. Pat. No. 4,484,089 issued to T. R. Viswanathan on Nov. 20, 1984 discloses a switched-capacitor arrangement for conductance and transconductance control of variable elements. Techniques for addressing transconductance in MOS circuits is disclosed in U.S. patent application Ser. No. 08/741,067 entitled "Method of Biasing MOSFET Amplifiers for Constant Transconductance", filed Oct. 30, 1996, and U.S. patent application Ser. No. 08/792,823 entitled "Stabilization of Gain-Bandwidth Product in Analog Circuit Devices", filed Jan. 30, 1997, describes particular arrangements suitable for stabilizing the gain-bandwidth product of MOS circuits, where both of these applications are assigned to the assignee of record for the present application.

There remains in the prior art, however, a need for an arrangement capable of stabilizing the gain-bandwidth product of analog circuits whose gm is defined by bipolar devices.

SUMMARY OF THE INVENTION

The problems associated with prior art stabilization techniques are addressed by the present invention, which relates to an arrangement for stabilizing the gain-bandwidth product (gm/C) of analog circuits including bipolar devices in which bipolar devices define the gm and, more particularly, to a stabilization arrangement capable of essentially eliminating changes in gm/C related to variations in processing and temperature.

In accordance with the teachings of the present invention, a stabilization circuit is implemented that provides a bias current to an associated analog circuit including bipolar devices (at least one of the bipolar devices controlling the gm of the analog circuit), an op-amp, for example, such that the gm/C of the analog circuit is essentially invariant with respect to temperature and processing variations. In particular, a stabilization circuit is formed to generate a reference current that is proportional to a reference capacitance $C_S$ and the thermal voltage $V_T$. The reference current is ultimately mirrored (as the biasing current) into the bipolar portion of the analog circuit. Since the transconductance (gm) of a bipolar device can be expressed (under ideal conditions) as the collector current divided by the thermal voltage ($I_C/V_T$), the thermal voltage ($V_T$) factor of the biasing current will "cancel" the thermal voltage factor present in the transconductance. Variations in the gain-bandwidth product related to the circuit capacitance can be essentially eliminated by implementing the reference capacitance to "track" the circuit capacitance by: (1) utilizing the same type of capacitance to implement both capacitors and (2) forming both the stabilization circuit and the analog circuit on the same silicon chip.

In accordance with one embodiment of the present invention, a stabilization circuit is further capable of creating a stabilized RC product using a field effect device operating in the triode region (hereinafter referred to as the "triode resistance") in addition to creating the above-defined stabilized gain-bandwidth product. The stabilization circuit of this embodiment includes a first module for generating a reference current, a triode resistance module coupled to the output of the reference current module and a biasing module coupled to the triode resistance module. The gate voltage, as well as a common-mode reference voltage associated with the triode resistance module, are used as inputs to the biasing module in this particular embodiment so that the biasing module can generate a current output that tracks (i.e., is a known, controlled multiple of) the thermal voltage $V_T$ and the current generated by the reference current module. This output current is then mirrored into the analog circuit and is used to form its biasing current for the included bipolar devices which determine gm. By virtue of the design of the present invention, the RC product will track the gain-bandwidth product, where both will be proportional to a fixed clock frequency used as an input to the stabilization circuit.

In an alternative embodiment where the need to stabilize the RC product is not necessary, the stabilization circuit of the present invention may be somewhat simplified, eliminating the triode resistance module and a portion of the biasing module. In yet another embodiment, a simplified triode resistance module may be included with the alternative stabilization circuit.

It is an advantage of the arrangement of the present invention that the disclosed stabilization arrangement results in both the gm/C and RC products being essentially independent of temperature and processing variations. This stabilization allows for the operation of the associated analog circuit whose gm is defined by included bipolar devices (an op-amp, for example) to be more robust by controlling the bandwidth variations. In particular, for closed loop applications (filters, buffers, gain stages, etc.), controlling the bandwidth variation eases the design for parameters such as signal bandwidth, stability (Q, phase margin), and noise bandwidth.

Other and further advantages of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
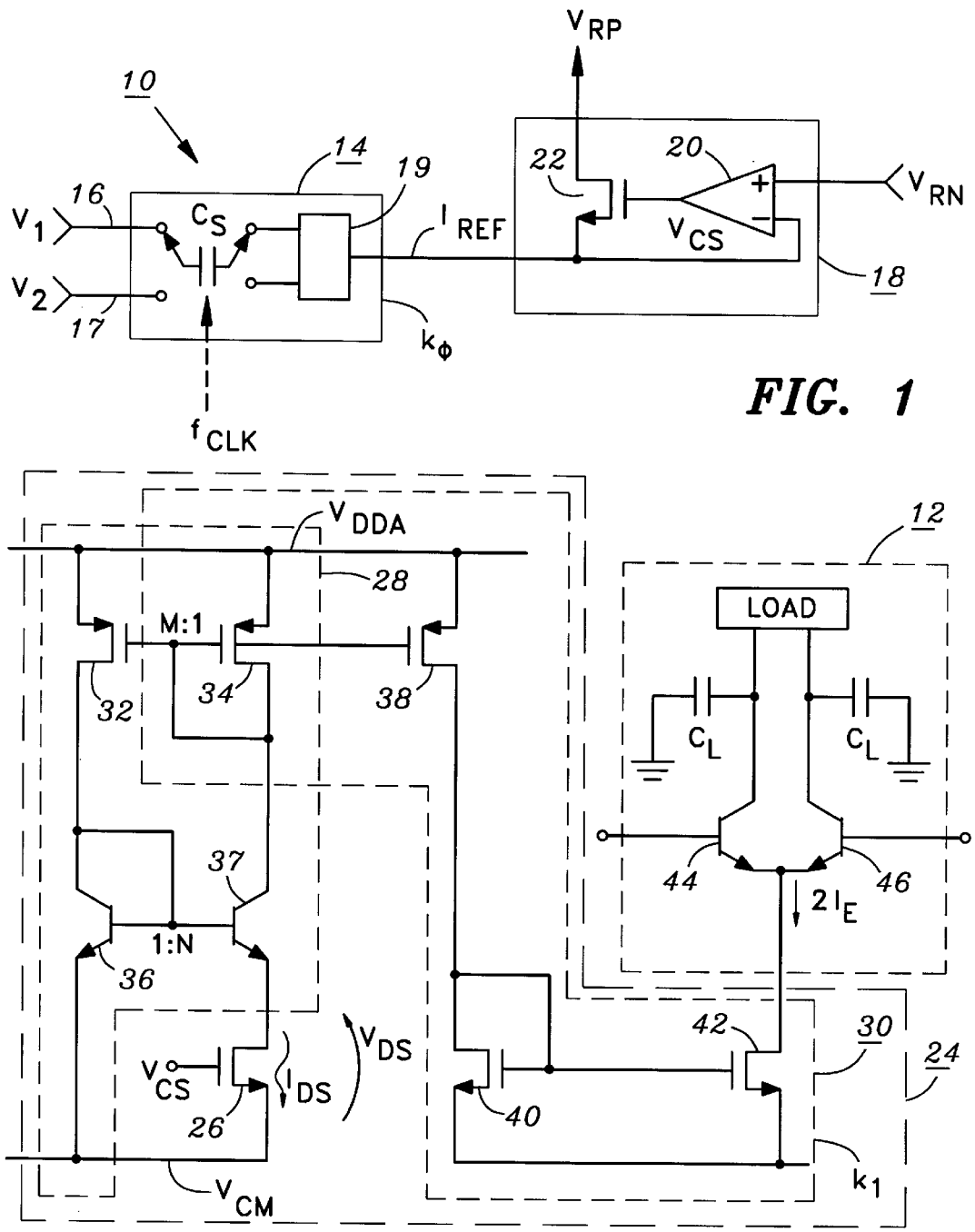
FIG. 1 illustrates an exemplary analog circuit in which included bipolar devices define gm (an operational amplifier in this example) and associated stabilization circuitry formed in accordance with the present invention, capable of controlling both gm/C and the triode RC product of related MOS devices and capacitors.

The following discussion with respect to the associated drawings will describe various stabilization circuit arrangements formed in accordance with the present invention. The particular embodiments illustrate the utilization of such stabilization circuits with an op-amp circuit including bipolar components. The use of an op-amp is intended to be exemplary only, since the stabilization circuits of the present invention are suitable for use with any analog circuit including bipolar devices which define the circuit gm (for example, filters, buffers and gain stages) where it is desired to control the gain-bandwidth product. Additionally, the particular circuit configurations forming the biasing module of the illustrated stabilization circuits are also considered to be exemplary; there exist many other circuit arrangements well-known in the art to provide essentially the same output characteristics as the illustrated embodiments. For example, the embodiments as described below include BiCMOS circuitry. An alternative arrangement may be configured, for example, substituting bipolar circuitry for appropriate portions of the stabilization circuit. Further, the MOS devices illustrated in the accompanying drawings could be replaced by any suitable type of field effect transistors, such as MESFETs, GaAsFETs, etc. Additionally, the polarity of various components is also considered to be merely a design choice. That is, some of the N-channel MOS devices as depicted in FIG. 1 may be replaced by similar P-channel devices (also, P-channel can be used in place of N-channel). Likewise, PNP bipolar transistors may be utilized in place of NPN transistors. As a result, the direction of certain currents associated with the overall stabilization circuit may be reversed, but the same general control in gain-bandwidth product would result. Thus, although the following discussion will describe certain currents as flowing in a particular direction or "applied as an input" to various devices, the directional nature of these statements are intended as exemplary only and associated with the particular embodiment being discussed. All of these above-described variations are considered to fall within the scope of the present invention as defined by the claims appended hereto.

Referring in particular to the drawings, FIG. 1 illustrates an exemplary stabilization circuit 10 for utilization with a conventional analog circuit 12, where in the example shown in FIG. 1, circuit 12 illustrates a portion of an op-amp including a differential pair of bipolar transistors. In general, stabilization circuit 10 is designed so as to provide a biasing current $2I_E$ to circuit 12 that is proportional to the same variables, $C_L$ and $V_T$, present in the gain-bandwidth product. Advantageously, these variables control the gain-bandwidth product and the generated biasing current in a manner such that their presence will "cancel", thus resulting in a gain-bandwidth product that exhibits little, if any, variation as a function of temperature or processing.

Stabilization circuit 10 includes a reference current module 14 that functions to generate a controlled output reference current. As shown, reference current module 14 includes a first input line 16 and a second input line 17, where in this particular embodiment a reference voltage $V_1$ is applied as the input along first input line 16 and second input line 17 receives a second reference voltage $V_2$. Any suitable fixed voltage potentials may be used as the inputs ($V_1$ and $V_2$) to reference current module 14, as will be discussed below in association with the embodiment of the present invention illustrated in FIG. 2. For the purposes of the present invention the relevant aspect is the difference, $V_1-V_2$, between the input reference voltages. Internal to module 14 is a switched-capacitor configuration, where the value of the capacitance is designated as $C_S$. The switching function within module 14 is controlled by a clock source (not shown), operating at a predetermined frequency $f_{CLK}$. An averaging circuit 19 uses the switched charges developed on capacitance $C_S$ and provides as an output an average (i.e., DC) current. The particular design of module 14 in general, and averaging circuit 19 in particular are not germane to the teachings of the present invention, and various techniques are well-known in the art for providing such a design. In general, the purpose of module 14 is to generate an output DC reference current $I_{REF}$ where $$I_{REF} = f_{CLK} * C_S * (V_1-V_2) * k_0, \qquad (1)$$

where $(V_1-V_2)$ is defined as the difference in voltage between the first and second inputs and $k_0$ is a multiplicative constant (magnitude and/or polarity factor) associated with the specific circuitry included within module 14.

Output reference current $I_{REF}$ is subsequently coupled to a triode resistance module 18. As shown in FIG. 1, triode resistance module 18 comprises a servo amplifier 20 and a MOS device 22 operating in its triode region. Amplifier 20 utilizes as its noninverting input a reference voltage $V_{RN}$. The voltage appearing at the output of amplifier 20 is designated $V_{CS}$ in FIG. 1 and is subsequently applied as the gate voltage to MOS device 22. Another reference voltage, $V_{RP}$ is coupled to the drain of MOS device 22. Reference voltages $V_{RP}$ and $V_{RN}$ are chosen such that the small signal and large signal triode resistances of MOS device 22 will reasonably track each other, as well as track the small signal and large signal triode resistances of a MOS triode device (MOS device 26) included in the biasing module discussed hereinbelow. The source of MOS device 22 is coupled to both $I_{REF}$ and the inverting input of amplifier 20, as shown in FIG. 1. Under preferred conditions, reference voltages $V_{RP}$, $V_{RN}$, and $V_1$, $V_2$ (the last two being the reference voltages input to current module 14) are all ultimately derived from the same "on-chip" voltage source. Therefore, all of these voltages will track together as a function of the above-described variations in temperature and processing. Referring back to FIG. 1, servo amplifier 20 in module 18 drives the gate of MOS device 22 such that it results in the two inputs to amplifier 20 becoming essentially equal, allowing the (small signal) triode resistance of MOS device 22 to be expressed as follows:

$$R_{TRIODE,22} = \frac{(V_{RP} - V_{RN})}{I_{REF}} = \left(\frac{V_{RP} - V_{RN}}{V_1 - V_2}\right)\frac{1}{f_{CLK} * C_S * k_0} \quad (2)$$

As mentioned above, an advantage of the circuit design of the present invention is that the RC product related to the above triode resistance value will be stabilized (i.e., invariant with respect to changes in processing and temperature) and will also track the resultant gain-bandwidth product gm/C. In particular, the RC product related to the above triode resistance can be expressed as follows:

$$C_S R_{TRIODE,22} = C_S \left[\left(\frac{V_{RP} - V_{RN}}{V_1 - V_2}\right)\left(\frac{1}{f_{CLK} * C_S * k_0}\right)\right] \quad (3)$$

Since the voltage-related factors will maintain an accurate ratio over the above-described parameters, $f_{CLK}$ is assumed to be an accurate clock source, and $k_0$ is an accurate magnitude scaling factor, the above expression may be simplified to the following form:

$$C_S R_{TRIODE,22} \alpha 1/f_{CLK}. \quad (4)$$

Therefore, the RC product is well-defined and essentially independent of temperature and processing variations. As a result, any other RC products derived from MOSFET triode resistors (with the same gate voltage as well as the same common-mode source/drain voltage) and capacitors formed on the same substrate, of similar type, and ratioed/scaled to these devices will likewise be essentially independent of temperature and processing.

Stabilization circuit 10 of FIG. 1 further includes a biasing module 24, where this module is utilized to generate the "stabilizing" bias current ultimately coupled to analog circuit 12. As shown, module 24 contains a MOS device 26 biased to operate in its triode region, a biasing circuit 28 and a current mirror circuit 30. Voltage $V_{CS}$, the output voltage from amplifier 20, is coupled to the gate of MOS device 26 and the source of MOS device 26 is coupled to a reference voltage $V_{CM}$, defined as the common mode voltage associated with MOS device 22. In particular, $V_{CM}=(V_{RP}+V_{RN})/2$ (since $V_{CM}$ is derived from a combination of $V_{RP}$ and $V_{RN}$, it will track (as a function of temperature and process variations) with the previously defined voltages). Since MOS device 26 is constrained to operate with a smaller drain to source voltage than MOS device 22, use of the common mode voltage of MOS device 22 as the source voltage for MOS device 26 ensures that the small signal characteristics of MOS device 26 will reasonably track the characteristics of MOS device 22. In particular, the utilization of the above-defined voltage potentials aids in replicating the characteristics of MOS device 22 into MOS device 26. That is, by applying these voltages to MOS devices 22 and 26 (as well as appropriate drain voltages), the triode resistances of both devices will essentially track (even though the actual drain-to-source voltages will be different). Since the triode resistance values will substantially track, the value for $R_{TRIODE,22}$ defined above can also be used to define the triode resistance of MOS device 26. If the relative sizes of MOS devices 22 and 26 are different, their actual resistances will ratio by a scaling factor, referred to as "$k_{RATIO}$" hereinbelow.

The drain to source voltage $V_{DS,26}$ of MOS device 26 is determined by the arrangement of biasing circuit 28. As shown in FIG. 1, a particular exemplary biasing circuit 28 comprises a pair of MOS devices 32 and 34, where the sources of both devices are coupled to a positive power supply and the gates of devices 32 and 34 are coupled together. Additionally, devices 32 and 34 are sized such that the effective width to length ratio (W/L) of device 32 is M times larger than that of device 34. Associated with MOS devices 32,34 is a pair of bipolar transistors 36 and 37, where the base and collector of transistor 36 are coupled to the drain of MOS device 32 and the collector of transistor 37 is coupled to both the gate and the drain of MOS device 34. The bases of transistors 36 and 37 are also coupled together. As shown in FIG. 1, the emitter of transistor 36 is coupled to both the source of MOS device 26 and reference voltage $V_{CM}$, and the emitter of transistor 37 is coupled to the drain of MOS device 26. Bipolar transistors 36 and 37 are sized, as illustrated in FIG. 1, such that the emitter area of transistor 37 is N times larger than the emitter area of transistor 36. Thus, utilizing the ratio factors of M:1 and 1:N, it can be shown that the drain to source voltage $V_{DS,26}$ appearing across MOS device 26 can be defined as follows:

$$V_{DS,26} = V_T \ln(M*N), \quad (5)$$

where $V_T$ is the thermal voltage kT/q. As is well known, the current $I_{DS,26}$ passing through MOS device 26 can be defined as $V_{DS,26}/R_{TRIODE,26}$ (where $R_{TRIODE,26}$ is the large signal resistance). As mentioned above, both the small signal and large signal triode resistances for MOS device 26 will essentially track each other, as well as track the triode resistance values associated with MOS device 22. Therefore, substituting for both $V_{DS,26}$ and $R_{TRIODE,26}$ yields the following for $I_{DS,26}$:

$$I_{DS,26} = \left(\frac{V_1 - V_2}{V_{RP} - V_{RN}}\right) * V_T * \ln(M*N) * f_{CLK} * C_S * k_0 * k_{RATIO}, \quad (6)$$

where $k_{RATIO}$ is the above-mentioned scaling factor related to any ratio between MOS device 22 and MOS device 26.

The current passing through MOS device 26 is then used, as shown in FIG. 1, to generate the biasing current for analog circuit 12. In particular, current $I_{DS,26}$ is subsequently coupled to current mirror circuit 30, where circuit 30 comprises MOS devices 34, 38, 40 and 42, configured to allow current $I_{DS,26}$ (with possible magnitude scaling and/or polarity reversal, $k_1$, as appropriate) to be coupled to analog circuit 12, as shown in FIG. 1, and used as the current, $2I_E$, which splits equally for the differential pair of bipolar transistors 44 and 46 forming a portion of op-amp of circuit 12. Current mirror 30 functions in a conventional manner where, as shown, a substantial portion of the DC current $I_{DS,26}$ passing through MOS device 26 will also flow through MOS device 34 (for large β of transistor 37). A second MOS device 38 is coupled at its gate and source terminals to MOS device 34, allowing current $I_{DS,26}$ to be mirrored into device 38, as well as the following MOS device 40. In the arrangement of current mirror 30 as shown in FIG. 1, MOS device 40 is coupled at its source and gate to MOS device 42 such that current $I_{DS,26}$ is subsequently mirrored into device 42, allowing this current (with the above-defined magnitude scaling and/or polarity reversal, $k_1$, as appropriate) to become the emitter current $2I_E$ for the differential pair of bipolar transistors of op-amp circuit 12.

For bipolar devices such as those included in circuit 12 of FIG. 1, the collector current $I_C$ and emitter current $I_E$ are related as follows:

$$I_C = [\beta/(1+\beta)]I_E, \quad (7)$$

where $\beta$ is defined as the DC current gain associated with the bipolar transistor. As long as $\beta$ is large enough (which is a usual condition in most applications), it can be assumed that the collector current $I_C$ is essentially equal to the emitter current $I_E$. Accordingly, the value for the emitter current can be expressed as follows:

$$I_E = \quad (8)$$
$$I_C = 1/2 \left( \frac{V_1 - V_2}{V_{RP} - R_{RN}} \right) * V_T * \ln(M*N) * f_{CLK} * C_S * k_0 * k_{RATIO} * k_1$$

The input transconductance, gm, of a bipolar device is ideally defined as $I_C/V_T$. Therefore, using the collector current value expressed in equation (8), the gain-bandwidtlh product grn/$C_L$ (where $C_L$ is defined as the load capacitance for the op-amp circuit) can he expressed as follows:

$$\frac{gm}{C_L} = \frac{(I_C/V_T)}{C_L} = \frac{\left[\left(\frac{V_1-V_2}{V_{RP}-V_{RN}}\right)*V_T*\ln(M*N)*f_{CLK}*C_S*k_0*k_{RATIO}*k_1\right]*1/V_T}{2C_L} \quad (9)$$
$$= 1/2\left(\frac{V_1-V_2}{V_{RP}-V_{RN}}\right)\left(\frac{C_S}{C_L}\right)*\ln(M*N)*f_{CLK}*k_0*k_{RATIO}*k_1$$

As long as $C_L$ tracks $C_S$, which can be achieved by utilizing the same type of device to form both capacitors and implementing both stabilization circuit 10 and analog circuit 12 on the same chip, these terms will track together and will not influence the gain-bandwidth product. Additionally, as mentioned above, as long as reference voltages $V_{RP}$, $V_{RN}$, $V_{CM}$ and $V_1$, $V_2$ are all generated from the same on-chip source, their variations will substantially track together such that their individual variations will not influence the gain-bandwidth product. These considerations thus allow for a simplification in the expression of the gain-bandwidth product as follows:

$$gm/C_L \alpha \ln(M*N)* f_{CLK}*k_0*k_{RATIO}k_1 \quad (10)$$

Thus, utilizing the stabilization circuitry of the present invention, the undesirable "variable" terms (i.e., $V_T$ and $C_L$) have been eliminated, resulting in a gain-bandwidth product that is stable over a relatively wide operating range, and is proportional to a known frequency ($f_{CLK}$) and a ratio of like circuit terms that can match/track.

Another feature associated with the particular stabilization circuit as described above is its ability to also provide a stable RC time constant using $R_{TRIODE,22}$, as defined in equation (2), where this is useful in situations where one also needs the ability to control the RC time constant of various devices, such as filters. Thus, the circuit design as described above, offers the ability to provide both a stable gain-bandwidth product, as well as a stable triode-based RC time constant. In particular, as shown from equations (2) and (10), the RC time constant and gain-bandwidth product will track together, as expressed in the following relation:

$$gm/C_L \alpha (R_{TRIODE,22}C_S)^{-1} \alpha f_{CLK}. \quad (11)$$

Figure 2:
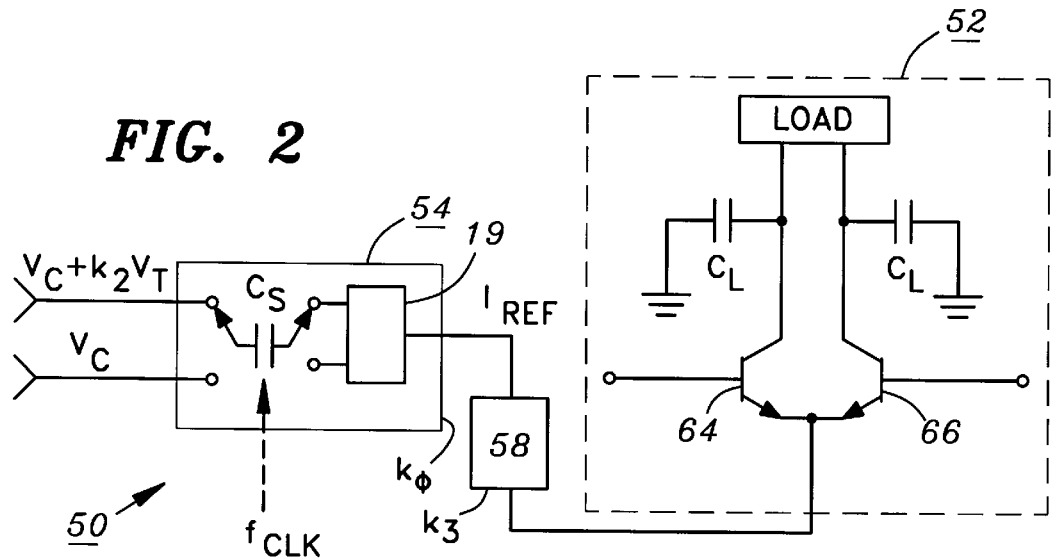
FIG. 2 illustrates an alternative stabilization arrangement particularly suited for controlling the gm/C of analog circuits in which included bipolar devices define the gm.

There may be situations, however, where the need to provide a stable RC time constant is not necessary. In these instances, the circuit of FIG. 1 may be simplified and still provide a stable gain-bandwidth product. FIG. 2 illustrates an alternative embodiment of the present invention that is suitable for this purpose. In particular, FIG. 2 contains a stabilization circuit 50 and associated analog circuit 52. Analog circuit 52 is similar in form and function to analog circuit 12 of FIG. 1. Again, the illustration of an op-amp as the analog circuit is considered to be exemplary, since the stabilization circuit of the present invention is usefull in association with any analog circuit in which bipolar devices define the gm and where it is desired to control the circuit gain-bandwidth product. Referring to FIG. 2, stabilization circuit 50 comprises a reference current module 54, of similar design as module 14 discussed above in association with FIG. 1. However, for the embodiment of FIG. 2, the inputs to module 54 comprise a first known voltage ($V_C$+$k_2V_T$) and a related voltage $V_C$. Thus, the difference between the two input voltages is proportional to the thermal voltage $V_T$, that is, ($V_C$+$k_2V_T$)−$V_C$=$k_2V_T$. Various circuits are well-known in the art for creating such reference voltages. Module 54 functions in a manner similar to that of current reference module 14 described above and therefore provides as an output a DC reference current $I_{REF}$ that can be defined as follows:

$$I_{REF} = f_{CLK}*C_S*k_2V_T*k_0. \quad (12)$$

In the simplified arrangement of FIG. 2, reference current $I_{REF}$ is coupled to a current mirror 58 so as to generate (with appropriate scaling and/or polarity reversal, $k_3$, as necessary) the bias current input for analog circuit 52. It is to be understood that if magnitude scaling or polarity reversal for reference current $I_{REF}$ are not required, current mirror 58 may be eliminated and the output of current reference module directly coupled to the bias current input of analog circuit 52. If a current mirror is required, it may be included within the circuit structure of the reference current module, as will be discussed below in association with the discussion of FIG. 3. Current mirror 58 (if used) can be of any arrangement well-known in the art (see, for example, U.S. Pat. No. 4,550,284 related to a cascode MOS current mirror arrangement). Analog circuit 52 includes a pair of bipolar devices 64, 66, with the emitters of these devices coupled together and also coupled to the output from current mirror 58. This arrangement, therefore, allows for reference current $I_{REF}$ to be coupled into circuit 52 in a manner whereby it becomes the emitter currents for the bipolar devices. Therefore, as discussed hereinabove in association with the embodiment of FIG. 1, $I_{REF}/2$ will be essentially equal (with magnitude scaling and/or polarity reversal, $k_3$, as appropriate) to the collector current $I_C$ for each transistor of the differential pair of bipolar transistors 64 and 66 of analog circuit 52 (presuming sufficient DC current gain $\beta$ so that $I_E \approx I_C$) Substituting from above, collector current $I_C$ can be defined by the following:

$$I_C = (\tfrac{1}{2}) f_{CLK}*C_S*k_2V_T*k_0*k_3 \quad (13)$$

where $k_3$ is the scaling factor related to current mirror 58. As before, the transconductance gm of a bipolar device is ideally defined by the relation $I_C/V_T$, and the gain-bandwidth product is $gm/C_L$. Substituting the values derived above thus results in the following:

$$gm/C_L = \frac{(f_{CLK}*C_S*k_2V_T*k_0*k_3)/V_T}{2C_L} \quad (14)$$
$$= (1/2)f_{CLK}*(C_S/C_L)*k_2*k_0*k_3$$

Since the values for $C_L$ and $C_S$ will track each other as long as both devices are of the same type of capacitance and are formed on the same integrated circuit, the above relation may be simplified as follows:

$$gm/C_L \alpha f_{CLK}*k_2*k_0*k_3 \quad (15)$$

The result, therefore, is that the gain-bandwidth is proportional only to the clock frequency and the circuit constants "k"; temperature and processing variations have been essentially eliminated.

Figure 3:
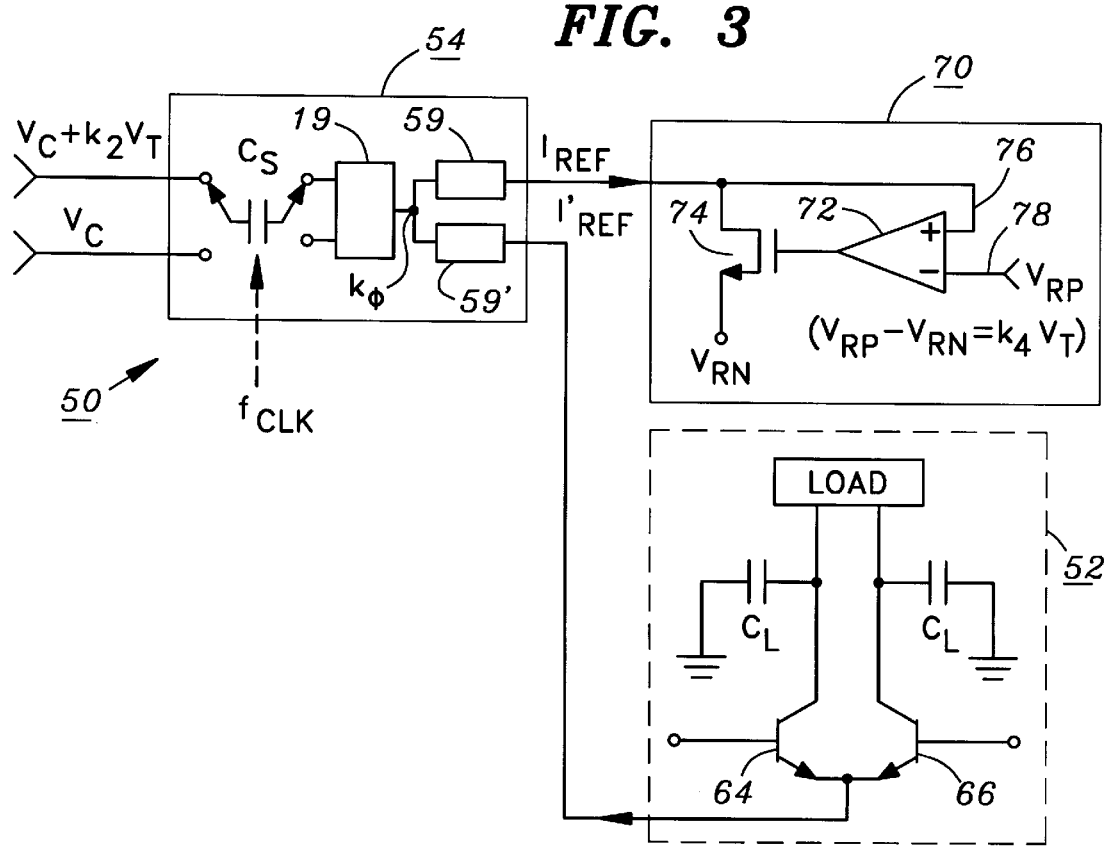
FIG. 3 illustrates an alternative circuit arrangement capable of providing stabilization for RC products, in addition to stabilization of the gm/C.

An alternative arrangement for providing a stabilized triode resistance is illustrated in FIG. 3, which shows an exemplary triode resistance stabilization circuit 70 that may be used in association with reference current module 54, discussed above in association with FIG. 2. Referring to FIG. 3, triode resistance stabilization circuit 70 includes an amplifier 72 and a MOS device 74 biased in its triode region, with the gate of MOS device 74 coupled to the output of amplifier 72. For the exemplary configuration of triode resistance module 70 of FIG. 3, reference current $I_{REF}$ from reference current module 54 is coupled to the non-inverting terminal 76 of amplifier 72. Additionally, the drain of MOS device 74 is coupled to $I_{REF}$. The inverting input terminal 78 of amplifier 72 is coupled to a reference voltage source $V_{RP}$, where this reference voltage and the source voltage applied to MOS 74 are chosen such that MOS device 74 will be operating in its triode region, the difference between these voltages being small enough such that the small signal resistance of MOS device 74 is acceptably close to its large signal resistance. The source of MOS device 74 is coupled to a voltage potential defined by $V_{RN}$. The reference voltages $V_{RP}$ and $V_{RN}$ are designed such that their difference is proportional to the thermal voltage, $V_T$, that is, $(V_{RP}-V_{RN})= k_4 V_T$. The small signal triode resistance associated with MOS device 74 can thus be expressed as follows:

$$R_{TRIODE,74}=(V_{RP}-V_{RN})/I_{REF}. \quad (16)$$

Since $I_{REF}$ can be expressed as $f_{CLK}*C_S*k_2V_T*k_0*k_3$ ($k_3$ being a scaling factor), the value for $R_{TRIODE,74}$ can be rewritten as follows:

$$R_{TRIODE,74} = \frac{k_4 V_T}{f_{CLK}C_S*k_2V_T*k_0*k_3} \quad (17)$$
$$= \frac{k_4}{k_2*k_0*k_3}\left(\frac{1}{f_{CLK}*C_S}\right)$$

Any of the RC time constants for a particular filter with MOS triode resistors that track $R_{TRIODE,74}$ (referred to generally as "$R_{FIL}$", where $R_{FIL}=k_5 R_{TRIODE,74}$) and capacitors $C_{FIL}$ that track $C_S$ which are formed on an integrated circuit including both stabilization circuits 50 and 70 would be defined by the relation:

$$C_{FIL}R_{FIL} = \left(\frac{C_{FIL}}{C_S}\right)\left(\frac{k_4*k_5}{k_2*k_0*k_3}\right)\left(\frac{1}{f_{CLK}}\right) \quad (18)$$

As shown, the RC constant is a function only of the clock frequency, as controlled by the user, the capacitor ratio, and the "k"-type scaling factors. Thus, the module as described above in association with FIG. 3 can be utilized to provide RC time constants that are essentially invariant to changes in processing or temperature.

A properly scaled version of $I_{REF}$ is also applied to analog circuit 52. As shown in FIG. 3, reference current module 54 has been modified from the version illustrated in FIG. 2 so as to include a current mirror 59. Current mirror 59 provides a first reference current $I_{REF}$ to triode resistance module 70 as described above. Similarly, a current mirror 59' provides a second reference current $I'_{REF}$ to analog circuit 52, where the only difference between $I_{REF}$ and $I'_{REF}$ will be any necessary magnitude scaling and/or polarity reversal.

Various other modifications to the above-described circuitry may be made by those skilled in the art and fall within the spirit and scope of the present invention. In particular, although the illustrated stabilization circuits have been described as used with an op-amp, it is to be understood that the stabilization technique of the present invention is useful in any analog circuit design in which bipolar devices determine the gm and where it is required to control the gain-bandwidth of the circuit. Such other circuits include, but are not limited to, filters, buffers, gain stages, and the like.

What is claimed is:

1. An integrated circuit including a circuit for stabilizing the gain-bandwidth product ($gm/C_L$) of an associated analog circuit including bipolar devices, the transconductance gm of an included bipolar device being ideally characterized by the relation $gm=I_C/V_T$, $I_C$ defined as the bipolar collector current and $V_T$ defined as the thermal voltage, and $C_L$ is defined as the load capacitance of said analog circuit, the stabilization circuit comprising:

a reference current module (14) including a switched capacitance of a predetermined value ($C_S$), for receiving as separate inputs a pair of voltage potentials ($V_1$, $V_2$) such that said predetermined capacitance is switched between said pair of input voltage potentials at a predetermined frequency ($f_{CLK}$), said reference current module thereby generating as an output a DC reference current $I_{REF}$, $I_{REF}$ being defined by the relation $I_{REF}=k* f_{CLK} *(V_1-V_2)* C_S$. where k is a scaling constant; and a biasing module (24) responsive to said reference current for coupling said reference current between said reference current module and said associated analog circuit such that said reference current is used to generate a bias current for said included bipolar devices, said bias current also being directly proportional to said thermal voltage so as to eliminate the effects of said thermal voltage introduced by said transconductance (gm), wherein the gain-bandwidth product $gm/C_L$ of said included bipolar devices is essentially invariant with respect to the load capacitance $C_L$ by the presence of the switched capacitance factor $C_S$ in said bias current such that $gm/C_L \alpha f_{CLK}$.

2. An integrated circuit as defined in claim 1 wherein the switched capacitance $C_S$ is of the same type as the load capacitance $C_L$ and the stabilization circuit and the associated analog circuit are implemented on the same circuit substrate.

3. An integrated circuit as defined in claim 1 wherein the stabilization circuit further comprises:

a triode resistance module (18) coupled to the output DC reference current $I_{REF}$ from the reference current module, and responsive at second and third inputs to a pair of reference voltages ($V_{RP}$, $V_{RN}$), said triode resistance module for generating all output voltage ($V_{CS}$) and exhibiting a triode resistance $R_{TRIODE}$ said triode resistance module comprising an amplifier (20) having first and second input terminals and an output terminal; and a field effect device (22) including a gate terminal drain terminal and source terminal, the gate terminal coupled to the output terminal of said amplifier and one of said drain and source terminals coupled to the output of the reference current module and a first input terminal of said amplifier, the remaining terminal of said field effect device coupled to a first reference voltage of said pair of reference voltages and the remaining input terminal of said amplifier coupled to the remaining reference voltage of said pair of reference voltages, the combination of said amplifier and said field effect device providing a triode resistance for said field effect device that is defined as follows:

$$R_{TRIODE} = \frac{(V_{RP} - V_{RN})}{f_{CLK} * C_S * (V_1 - V_2) * k}$$

wherein said triode resistance module provides a stabilized RC time product with the switched capacitance value $C_S$ defined as follows:

$$C_S R_{TRIODE} = \left(\frac{V_{RP} - V_{RN}}{V_1 - V_2}\right)\left(\frac{1}{f_{CLK} * k}\right)$$

4. An integrated circuit as defined in claim 3 wherein the amplifier includes an inverting input terminal and a non-inverting input terminal, the inverting input coupled to the output from the reference current module and coupled to the source terminal of the field effect device.

5. An integrated circuit as defined in claim 3 wherein the amplifier includes an inverting input terminal and a non-inverting input terminal, the non-inverting input coupled to the output from the reference current module and coupled to the drain terminal of the field effect device.

6. An integrated circuit as defined in claim 3 wherein the biasing module comprises a field effect triode device (26), the gate of said triode device coupled to the output voltage generated by the triode resistance module and the source coupled to a common-mode reference voltage derived from the triode resistance module pair of reference voltages;

a biasing circuit (28) coupled between the drain and source of said field effect triode device, the output of said biasing circuit coupled to the drain and source of said field effect triode device, said biasing circuit configured to provide a drain to source voltage $V_{DS}$ for said field effect triode device that is defined by the following relation:

$$V_{DS} = x\, V_T,$$

where x is a scaling factor, the combination of said field effect triode device and said biasing circuit creating a drain to source current IDS passing through said field effect triode device that can be defined as follows:

$$I_{DS} = \frac{x * V_T * f_{CLK} * (V_1 - V_2) * C_S * k}{(V_{RP} - V_{RN})}$$

where k is a scaling factor; and a current mirror circuit (30) coupled to receive said field effect triode device drain to source current ($I_{DS}$) for coupling said current as the bias current to the associated analog circuit.

7. An integrated circuit as defined in claim 6 wherein the biasing circuit comprises a current mirror configured to provide an output current that is M times greater than the reference current applied as an input thereto; and a pair of bipolar transistors (36,37), the collector of each transistor coupled to the current mirror, the bases of said pair of bipolar transistors being coupled to each other and to the current mirror, the pair of bipolar transistors configured such that the emitter area of one device is N times larger than the emitter area of the other, the emitter of the smaller device being coupled to a common mode reference potential $V_{CM}$, where $V_{CM}$ is equal to $(V_{RP}+V_{RN})/2$, and the emitter of the larger coupled to the drain input of the field effect triode device, wherein the biasing circuit is capable of providing a drain to source voltage for said field effect triode device that can be defined as follows:

$$V_{DS} = V_T * \ln(M*N)$$

and thereby generate a bias current defined by:

$$I_{DS} = \left(\frac{V_1 - V_2}{V_{RP} - V_{RN}}\right) * V_T * \ln(M * N) * f_{CLK} * C_S * k$$

8. An integrated circuit as defined in claim 7 wherein the current mirror comprises a pair of field effect devices (32,34) coupled at their sources to a reference voltage potential, the gates of said pair of field effect devices being coupled to each other and said devices configured such that the effective width-to-length ratio W/L, of one device is M times larger than the effective width-to-length ratio of the other device, the drain of the smaller device coupled to the gates, as well as to the collector of the larger bipolar transistors of the pair of bipolar transistors, and the drain of the larger field effect device is coupled to the collector of the remaining, smaller bipolar transistor.

9. An integrated circuit as defined by claim 1 wherein the pair of input voltage potentials applied to the reference current module exhibit a $V_1-V_2$ substantially equal to $kV_T$, where $V_T$ is defined as the thermal voltage kT/q, said reference current module thereby generating a DC reference current $I_{REF}$ defined as follows:

$$I_{REF} = f_{CLK} * C_S * kV_T.$$

10. An integrated circuit as defined by claim 9 wherein the biasing module comprises a current mirror coupled between the output of said reference current module and the input to the associated analog circuit so as to provide the DC reference current $I_{REF}$ as the bias current input to the bipolar devices of said analog circuit which define the gm of said analog circuit.

11. An integrated circuit as defined in claim 10 wherein the current mirror is included as a component of the reference current module and is capable of providing a first reference current $I_{REF}$ to a triode resistance module, said triode resistance module responsive at second and third inputs to a pair of reference voltages ($V_{RF}$, $V_{RN}$) for generating an output voltage ($V_{CS}$) and exhibiting a triode resistance $R_{TRIODE}$, and a second reference current $I'_{REF}$ to the bipolar devices of said analog circuit which define the gm of said analog circuit.

12. An integrated circuit as defined in claim 11 wherein the pair of reference voltages associated with the triode resistance module ($V_{RP}$ and $V_{RN}$) are defined by the relation $V_{RP} - V_{RN} = kV_T$.

* * * * *